(12) United States Patent
Reinoso et al.

(10) Patent No.: US 7,863,221 B2
(45) Date of Patent: Jan. 4, 2011

(54) METHOD FOR PRODUCING A SUPERCONDUCTING MATERIAL MADE OF MGB$_2$

(75) Inventors: Juan Matias Reinoso, Winterthur (CH); Frank Ottinger, Zurich (DE); Michael Woerle, Zurich (CH); Reinhard Nesper, Kilchberg (CH)

(73) Assignee: Eidenossische Technische Hochschule Zurich, Zurich (CH)

( * ) Notice: Subject to any disclaimer, the term of this patent is extended or adjusted under 35 U.S.C. 154(b) by 1372 days.

(21) Appl. No.: 10/469,820

(22) PCT Filed: Mar. 4, 2002

(86) PCT No.: PCT/CH02/00131

§ 371 (c)(1),
(2), (4) Date: Feb. 12, 2004

(87) PCT Pub. No.: WO02/071499

PCT Pub. Date: Sep. 12, 2002

(65) Prior Publication Data

US 2004/0132623 A1 Jul. 8, 2004

(30) Foreign Application Priority Data

Mar. 5, 2001 (CH) .................................... 0411/01

(51) Int. Cl.
*H01B 12/00* (2006.01)
*H01L 39/24* (2006.01)

(52) U.S. Cl. .................. 505/300; 505/100; 505/230; 505/430; 505/510; 419/32; 420/400; 420/402; 420/591

(58) Field of Classification Search .................. 252/500; 505/100, 104, 230, 238, 430, 452; 420/400, 420/402, 580, 591
See application file for complete search history.

(56) References Cited

U.S. PATENT DOCUMENTS 3,258,316 A * 6/1966 Frederick et al. ............ 423/250
5,156,806 A * 10/1992 Sutula et al. ................. 420/400
6,514,557 B2 * 2/2003 Finnemore et al. ............ 427/62
6,626,995 B2 * 9/2003 Kim et al. .................... 117/101
6,630,427 B2 * 10/2003 Dunand ....................... 505/452
2002/0164418 A1 * 11/2002 Fischer et al. ............... 427/180

FOREIGN PATENT DOCUMENTS

FR       2 563 535       10/1985

OTHER PUBLICATIONS

Zhao et al, "Effect of Li doping on structure and superconducting transition temperature of Mg1-xLixB2," Physica C, 2001, V361, pp. 91-94.*
Slusky et al, "Loss of superconductivity with the addition of Al to MgB2 and a structural transition in Mg1-xAlxB2," Nature, 2001, V410, pp. 343-345.*
Feiner, "Absence of Superconductivity in BeB2," Physica C., 2001, V 353, pp. 11-13.*
Pena et al, "Effects of Al doping on the structural and electronic properties of Mg1-xAlxB2," Physical Review B, 2002, 66, 012511.*
Medvedeva et al, "Electronic Structure of superconducting MgB2 and related binary and ternary borides," Physical Review B, 2001, V64, 020502(R).*
Superconductors, www.superconductor.org, 1999, pp. 1-3.*
What is superconductivity?, www.science.howstuffworks.com/question610.htm/printable, 1998-2009; pp. 1-3.*
CRC Handbook of Chemistry and Physics, 89th edition, 2008-2009; pp. 2-50, 12-56 to 12-71.*
MSDS, "Li-Wire", by Aciallloys, pp. 1-6, 1997.*
Canfield, P.C. et al; "Superconductivity in dense MgB2 Wires"; Database Caplus 'Online! Chemical Abstracts Service; Columbus,Ohio, US; Feb. 17, 2001.
Sumption, M.D. et al; "Transport Current in MgB2 Based Superconducting Strand at 4.2 K and Self-field"; Databasse Caplus 'Online; Columbus, Ohio, US; Feb. 23, 2001.

* cited by examiner

*Primary Examiner*—Stanley Silverman
*Assistant Examiner*—Kallambella Vijayakumar
(74) *Attorney, Agent, or Firm*—Browdy and Neimark, P.L.L.C.

(57) ABSTRACT

For producing the superconducting material MgB2, a shapeable master alloy containing Mg and B, as well as at least one additional constituent, an LiMgB alloy is.[1] The process permits the production of shaped elements of MgB2, for example by forging, casting, drawing, etc.

9 Claims, No Drawings

METHOD FOR PRODUCING A SUPERCONDUCTING MATERIAL MADE OF MGB$_2$

The present invention is concerned with a process for producing the superconducting material MgB$_2$ in various geometric forms. The invention is additionally concerned with a material produced according to this process, as well as with a master alloy for performing this process.

MgB$_2$ has been known for a long time. It crystallizes in the hexagonal AlB$_2$ structure and consists of alternating layers of Mg atoms and graphite-like layers of B. The superconducting properties have been discovered only in January 2001 and they were spectacular because of the high critical temperature of 39 K. Reference is made in this context to the publications by S. L. Bud'ko, G. Lapertot, G. Petrovic, C. E. Cunningham, N. Anderson and P. C. Canfield, Ames Laboratory and Department of Physics and Astronomy Iowa State University, Ames, Iowa 50011 (Jan. 30, 2001), and J. Kortus, I. I. Mazin, K. D. Belashchenko, V. P. Antropov, L. L. Boyer, Center for Computational Material Science, Code 6390, Naval Research Laboratory, Washington, D.C. 20375, Ames Laboratory, ISU, Ames, Iowa 50011 (Jan. 30, 2001).

MgB$_2$ is very brittle, and producing technical components and particularly wires from this material is expensive.

The invention is based on the objective of creating a process that permits the production of shaped elements from superconducting MgB$_2$. This object is met in such a way that a shapeable master alloy containing Mg and B, as well as at least one additional constituent is produced, and this at least one additional constituent is removed from the shaped master alloy. In the inventive process it is, therefore, not the superconducting material that is processed to produce the desired shape, but a shapeable master alloy. A particularly suitable master alloy is a LiMgB alloy. It can be produced as a very stable phase and is forgeable, castable and pressable, for example. After the shaping of this master alloy, it is converted into the superconducting material by removing the Li. The removal of the Li can take place without altering the shape. After the shaping of the master alloy, the shape is, therefore, maintained during the transition to the superconducting material. LiMgB is known per se as an electrode material from FR-A-2 563 535.

The master alloy can be produced in a molten mass at a temperature of 180°-600° C. It has been shown that a melting temperature between 180° C. and 450° C. is particularly advantageous. However, the master alloy may also be produced by grinding the constituents, especially by cold grinding. At a temperature of approximately 450° C., the phase is very homogenous and, with an additional temperature increase, transitions into a pasty state. In this state, the master alloy can be shaped. Alternatively, the homogenous phase of the master alloy may be cooled and subsequently shaped, for example forged or pressed, due to its ductility.

The additional constituent and especially Li can be removed by heat-treatment. This is preferably done in the vacuum. However, removal of the additional constituent is possible also by means of other chemical or physical processes, for example by means of electrolysis or solvolysis.

A particularly suitable composition of the master alloy consists of 10%-97% (atom percent) Li, 1%-30% (atom percent) Mg, and 2%-60% (atom percent) B.

The master alloy is particularly suitable for doping, for example with Be and/or Al.

The material produced according to the process is specifically a shaped element. Specifically, this shaped element is a wire, specifically a forged, pressed or drawn wire.

In the inventive process, a homogenous phase is produced by melting Mg and B and one additional constituent, specifically Li. The melting process takes place at a temperature range between 180°-600°, preferably between 180°-450° C. Other temperature ranges, however, are conceivable as well. One production process, for example, is also produced by grinding the above constituents and specifically by cold grinding. A very high homogeneity is attained in this molten mass at higher temperatures, for example at approximately 450° C. If this temperature is exceeded, the LiMgB alloy becomes increasingly harder. This behavior, which is unusual in itself, can be utilized to produce a pre-shapeable master alloy. The master alloy is shaped, for example forged, at this increased temperature, at which it is hard, for example pasty and ductile. By means of a heat-treatment in the vacuum this shaped master alloy is converted into the superconducting material. In the course of this treatment, the Li, or the additional constituent, is removed. Alternatively to the heat-treatment, it is also possible to remove the additional constituent electrolytically by deintercalation. The additional constituent may furthermore also be removed chemically. Particularly suitable in this context is a solvolysis, for example in alcohol, specifically isopropanol or isopropanol/ethanol mixtures.

The master alloy may be doped. Specifically, Mg may be over-doped. Doping is particularly advantageous with Be and/or Al.

For the forming of the master alloy, a great number of possible processes are available because of the ductility of this master alloy. Specifically, the master alloy may be forged, cast, pressed or extruded. This may be done at a raised temperature, specifically at a temperature above 450° C., or also in a cooled state at room temperature. In essence, it is possible to produce any shape. Of particular technical interest, however, is the manufacture of wires, which can be produced very easily in desired diameters and lengths.

What is claimed is:

1. A process for producing a MgB$_2$ superconductor, characterized in that a shapeable master alloy containing Mg and B, as well as at least one additional constituent is produced and processed to a desired shape, and the at least one additional constituent is at least partially removed from the shapeable master alloy to produce the MgB$_2$ superconductor, wherein the shapeable master alloy comprises 1-30% (atom percent) Mg and 2-60% (atom percent) B, wherein the shapeable master alloy is a the LiMgB alloy.

2. The process according to claim 1, wherein the LiMgB alloy is produced in a molten mass at 180°-600° C.

3. The process according to claim 2, wherein the LiMgB alloy is produced in a molten mass at 180°-450° C.

4. A process for producing a MgB$_2$ superconductor, characterized in that a shapeable master alloy containing Mg and B, as well as at least one additional constituent is produced and processed to a desired shape, and the at least one additional constituent is at least partially removed from the shapeable master alloy to produce the MgB$_2$ superconductor, wherein the shapeable master alloy comprises 1-30% (atom percent) Mg and 2-60% (atom percent) B, and the shapeable master alloy is a LiMgB alloy produced by grinding the constituents, specifically by cold grinding.

5. A process for producing a MgB$_2$ superconductor, characterized in that a shapeable master alloy containing Mg and B, as well as at least one additional constituent is produced and processed to a desired shape, and the at least one additional constituent is at least partially removed from the shapeable master alloy to produce the MgB$_2$ superconductor, wherein the shapeable master alloy comprises 1-30% (atom percent) Mg and 2-60% (atom percent) B, and the at least one additional constituent is removed electrolytically by deintercalation.

6. A process for producing a $MgB_2$ superconductor, characterized in that a shapeable master alloy containing Mg and B, as well as at least one additional constituent is produced and processed to a desired shape, and the at least one additional constituent is at least partially removed from the shapeable master alloy to produce the $MgB_2$ superconductor, wherein the shapeable master alloy has a composition as follows:

Li 10-97% (atom percent),
Mg 1-30% (atom percent), and
B 2-60% (atom percent).

7. A process for producing a $MgB_2$ superconductor, characterized in that a shapeable master alloy containing Mg and B, as well as at least one additional constituent is produced and processed to a desired shape, and the at least one additional constituent is at least partially removed from the shapeable master alloy to produce the $MgB_2$ superconductor, wherein the shapeable master alloy comprises 1-30% (atom percent) Mg and 2-60% (atom percent) B, and the shapeable master alloy is doped.

8. The process according to claim 7, wherein the shapeable master alloy is doped with Be and/or Al.

9. A process for producing a $MgB_2$ superconductor, characterized in that a shapeable master alloy containing Mg and B, as well as at least one additional constituent is produced and processed to a desired shape, and the at least one additional constituent is at least partially removed from the shapeable master alloy to produce the $MgB_2$ superconductor, wherein the shapeable master alloy comprises 1-30% (atom percent) Mg and 2-60% (atom percent) B, and the Mg is doped.

* * * * *